(12) United States Patent
Ku et al.

(10) Patent No.: US 11,028,201 B2
(45) Date of Patent: Jun. 8, 2021

(54) POLYMER COMPOSITION

(71) Applicant: LG Chem, Ltd., Seoul (KR)

(72) Inventors: Se Jin Ku, Daejeon (KR); Mi Sook Lee, Daejeon (KR); Hyung Ju Ryu, Daejeon (KR); Sung Soo Yoon, Daejeon (KR); No Jin Park, Daejeon (KR); Jung Keun Kim, Daejeon (KR); Je Gwon Lee, Daejeon (KR); Eun Young Choi, Daejeon (KR)

(73) Assignee: LG Chem, Ltd.

( * ) Notice: Subject to any disclaimer, the term of this patent is extended or adjusted under 35 U.S.C. 154(b) by 53 days.

(21) Appl. No.: 16/465,357

(22) PCT Filed: Nov. 29, 2017

(86) PCT No.: PCT/KR2017/013790
§ 371 (c)(1),
(2) Date: May 30, 2019

(87) PCT Pub. No.: WO2018/101731
PCT Pub. Date: Jun. 7, 2018

(65) Prior Publication Data
US 2019/0292286 A1 Sep. 26, 2019

(30) Foreign Application Priority Data

Nov. 30, 2016 (KR) .......................... 10-2016-0162138

(51) Int. Cl.
| | | |
|---|---|---|
| *C08F 212/08* | (2006.01) | |
| *C08F 220/18* | (2006.01) | |
| *C08F 220/22* | (2006.01) | |
| *C08F 228/02* | (2006.01) | |
| *C08F 293/00* | (2006.01) | |
| *C08L 53/00* | (2006.01) | |
| *C08F 220/38* | (2006.01) | |
| *G03F 1/00* | (2012.01) | |
| *H01L 21/027* | (2006.01) | |
| *H01L 21/311* | (2006.01) | |

(52) U.S. Cl.
CPC .......... *C08F 220/18* (2013.01); *C08F 212/08* (2013.01); *C08F 220/22* (2013.01); *C08F 220/38* (2013.01); *C08F 228/02* (2013.01); *C08F 293/005* (2013.01); *C08L 53/005* (2013.01); *G03F 1/00* (2013.01); *H01L 21/027* (2013.01); *H01L 21/311* (2013.01)

(58) Field of Classification Search
CPC .... C08F 212/08; C08F 220/18; C08F 220/22; C08F 220/38; C08F 228/02; C08F 293/00; C08F 293/005; C08F 2438/03; C09D 153/00; C08L 53/005; C08L 53/00; C08L 2205/02; C08L 2205/025
See application file for complete search history.

(56) References Cited

U.S. PATENT DOCUMENTS

| | | |
|---|---|---|
| 5,391,626 A | 2/1995 | Machida et al. |
| 2013/0209694 A1 | 8/2013 | Chang et al. |
| 2013/0209696 A1 | 8/2013 | Sharma et al. |
| 2013/0209755 A1 | 8/2013 | Hustad et al. |
| 2015/0073096 A1 | 3/2015 | Navarro et al. |
| 2015/0376408 A1* | 12/2015 | Zhang ............... H01L 21/31116 216/49 |
| 2016/0186002 A1 | 6/2016 | Hustad et al. |
| 2016/0280832 A1 | 9/2016 | Kim et al. |
| 2016/0280835 A1 | 9/2016 | Lee et al. |
| 2017/0247492 A1 | 8/2017 | Choi et al. |

FOREIGN PATENT DOCUMENTS

| | | |
|---|---|---|
| CN | 103304950 A | 9/2013 |
| CN | 103319835 A | 9/2013 |
| JP | 3121116 B2 | 12/2000 |
| JP | 2005008701 A | 1/2005 |
| JP | 2015061905 A | 4/2015 |
| JP | 2016128565 A | 7/2016 |
| KR | 100935863 B1 | 1/2010 |
| KR | 20130138399 A | 12/2013 |
| KR | 20150067066 A | 6/2015 |
| KR | 20150067073 A | 6/2015 |
| KR | 20150067074 A | 6/2015 |
| KR | 101555192 B1 | 9/2015 |
| WO | 2015084129 A1 | 6/2015 |
| WO | 2015084133 A1 | 6/2015 |
| WO | 2016053005 A1 | 4/2016 |

OTHER PUBLICATIONS

Jeon et al. Macromolecules vol. 32 pp. 1803-1808 (Year: 1999).*
Machine translation of KR20130138399 (Year: 2020).*
International Search Report for PCT/KR2017/013790 dated Feb. 22, 2018.

* cited by examiner

Primary Examiner — Irina S Zemel
Assistant Examiner — Jeffrey S Lenihan
(74) Attorney, Agent, or Firm — Lerner, David, Littenberg, Krumholz & Mentlik, LLP

(57) ABSTRACT

A polymer composition, methods and a use thereof are disclosed herein. The polymer composition having excellent self-assembly properties and capable of forming a vertical orientation structure even on a surface that no neutral treatment is performed, where the vertically oriented self-assembled structure can be effectively formed in a short time.

19 Claims, 1 Drawing Sheet

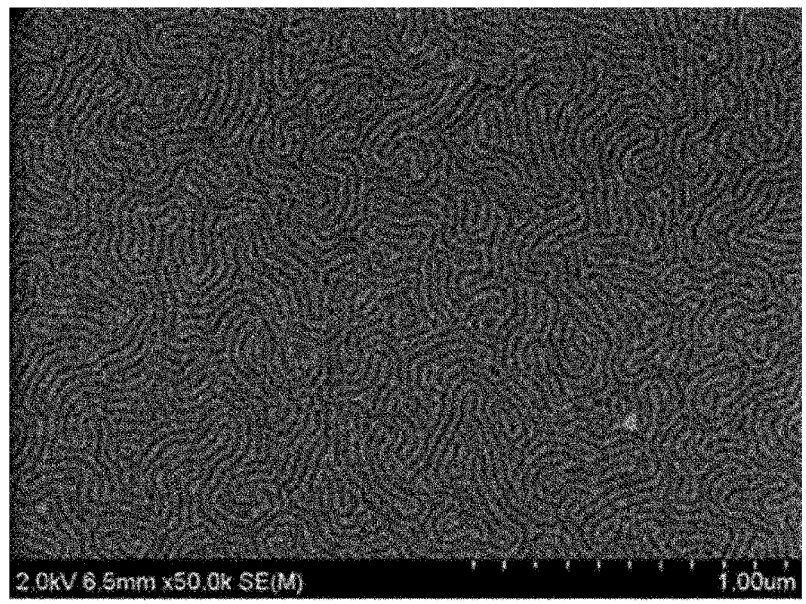

POLYMER COMPOSITION

CROSS-REFERENCE TO RELATED APPLICATION(S)

The present application is a national phase entry under 35 U.S.C. § 371 of International Application No. PCT/KR2017/013790, filed on Nov. 29, 2017, which claims priority from Korean Patent Application No. 10-2016-0162138, filed on Nov. 30, 2016, the disclosures of which are incorporated herein by reference.

TECHNICAL FIELD

The present application relates to a polymer composition and a use thereof.

BACKGROUND ART

A block copolymer has a molecular structure in which polymer segments having different chemical structures are linked via covalent bonds. The block copolymer can form a periodically arranged structure such as a sphere, a cylinder or a lamella by phase separation. The domain size of the structure formed by a self-assembly phenomenon of the block copolymer can be widely controlled and various types of structures can be manufactured, so that the block copolymer can be applied to high density magnetic storage media, nanowire fabrication, various next-generation nano devices such as quantum dots or metal dots or magnetic recording media, or pattern formation by lithography, and the like.

DISCLOSURE

The polymer composition of the present application comprises at least two kinds of block copolymers having different number average molecular weights from each other. In this specification, for convenience, any one block copolymer of the two block copolymers having different number average molecular weights from each other may be referred to as a first block copolymer and the other block copolymer may be referred to as a second block copolymer. The designation is merely for distinguishing the two block copolymers from each other, and one block copolymer does not prefer the other block copolymer.

The term number average molecular weight is a converted value for standard polystyrene measured using GPC (gel permeation chromatograph), and the term molecular weight herein means a number average molecular weight, unless otherwise specified.

As the polymer composition comprises two kinds of block copolymers as above, the composition can exhibit excellent self-assembly properties. In particular, the polymer composition may exhibit so-called self-assembly properties even on a substrate, the surface of which no neutral treatment is performed.

In this specification, the term neutral treatment is a concept including a treatment referred to as a so-called neutral brush layer or chemical preliminary patterning, and the like in the industry, which has a meaning including a known treatment performed in order to achieve vertical orientation in the industry.

Each block copolymer may comprise a first polymer segment and a second polymer segment different from the first polymer segment. Each block copolymer may be a diblock copolymer comprising the two segments or a block copolymer comprising two or more polymer segments.

The first and second polymer segments included in the block copolymer are different polymer segments from each other.

In the present application, the fact that two kinds of polymer segments are identical means any one case of cases in which in any two kinds of polymer segments the kinds of monomer units contained as the main component are identical to each other, or 50% or more, 55% or more, 60% or more, 65% or more, 70% or more, 75% or more, 80% or more, 85% or more or 90% or more of monomer unit kinds contained in two kinds of polymer segments are common and a weight ratio deviation of the common monomer units in each polymer segment is within 30%, within 25%, within 20%, within 20%, within 15%, within 10% or within 5%. Here, the monomer unit that the polymer segment comprises as a main component is a monomer unit in which 60% or more, 65% or more, 70% or more, 75% or more, 80% or more, 85% or more, or 90% or more is included and 100% or less is included in the corresponding polymer segment. If both polymer segments do not satisfy the two cases, they are polymer segments that are different from each other. Here, it may be proper that the ratio of the common monomer units is satisfied for both polymer segments. For example, if any polymer segment 1 has monomer units of A, B, C, D and F and the other polymer segment 2 has monomer units of D, F, G and H, then the common monomer units in polymer segments 1 and 2 are D and F, where in the position of polymer segment 1 the common ratio is 40% (=100×2/5) because two kinds of the total five kinds are common, but in the position of polymer segment 2 the ratio is 50% (=100×2/5). Thus, in this case, both polymer segments may be regarded as not identical because the common ratio is not less than 50% only in polymer segment 2. On the other hand, the weight ratio deviation of the common monomers is a percentage of a numerical value in which a large weight ratio minus a small weight ratio is divided by the small weight ratio. For example, in the above case, if the weight ratio of the D monomer units in the segment 1 is about 40% based on 100% of the total weight ratio of the whole monomer units in the segment 1 and the weight ratio of the D monomer units in the segment 2 is about 30% based on 100% of the total weight ratio of the whole monomer units in the segment 2, the weight ratio deviation may be about 33% (=100×(40−30)/30) or so. If the common monomer units are two or more kinds in two segments, in order to be the same segment, it can be considered as the common monomers when the weight ratio deviation within 30% is satisfied for all the common monomers or for the monomer unit as the main component. Each polymer segment that is recognized as the same by the above criteria may be a different type of polymer (e.g., any one segment is in the form of a block copolymer and the other segment is in the form of a random copolymer), but it may be, suitably, the same type of polymer.

In this specification, any one of two segments included in the first block copolymer may be referred to as a polymer segment A, and the other segment may be referred to as a polymer segment B.

Also, any one of two segments included in the second block copolymer may be referred to as a polymer segment C, and the other segment may be referred to as a polymer segment D.

In one example, the polymer segment A included in the first block copolymer and the polymer segment C included in the second block copolymer may be the same polymer segment. In addition, the polymer segment B included in the first block copolymer and the polymer segment D included in the second block copolymer may be the same polymer segment.

In the polymer composition of the present application, the first and second block copolymers have different number average molecular weights, where the first block copolymer may have a number average molecular weight higher than that of the second block copolymer.

In this case, the ratio (M1/M2) of the molecular weight (M1) of the first block copolymer to the molecular weight (M2) of the second block copolymer may be in a range of 1.05 to 10. In another example, the ratio (M1/M2) may be 1.1 or more, 1.5 or more, 2 or more, 2.5 or more, or 3 or more. Also, in another example, the ratio (M1/M2) may be 9.5 or less, 9 or less, 8.5 or less, 8 or less, 7.5 or less, 7 or less, 6.5 or less, 6 or less, 5.5 or less, 5 or less, 4.5 or less, or 4 or less. Under such a ratio, the self-assembly property and the vertical orientation property—of the polymer composition can be improved.

Here, the number average molecular weight (M1) of the first block copolymer may be in a range of 30 to 150 Kg/mol. In another example, the molecular weight of the first block copolymer may be about 35 Kg/mol or more, 40 Kg/mol or more, 45 Kg/mol or more, 50 Kg/mol or more, 55 Kg/mol or more, 60 Kg/mol or more, 65 Kg/mol or more, or 70 Kg/mol or more. In another example, the molecular weight of the first block copolymer may be 145 Kg/mol or less, 140 Kg/mol or less, 135 Kg/mol or less, 130 Kg/mol or less, 125 Kg/mol or less, 120 Kg/mol or less, 115 Kg/mol or less, 110 Kg/mol or less, 105 Kg/mol or less, 100 Kg/mol or less, 95 Kg/mol or less, 90 Kg/mol or less, 85 Kg/mol or less, or 80 Kg/mol or less.

On the other hand, the number average molecular weight (M2) of the second block copolymer may be in a range of 10 to 80 Kg/mol. In another example, the molecular weight of the second block copolymer may be about 15 Kg/mol or more, or 20 Kg/mol or more. In another example, the molecular weight of the second block copolymer may be 75 Kg/mol or less, 70 Kg/mol or less, 65 Kg/mol or less, 60 Kg/mol or less, 55 Kg/mol or less, 50 Kg/mol or less, 45 Kg/mol or less, 40 Kg/mol or less, 35 Kg/mol or less, or 30 Kg/mol or less.

Besides, the difference (M1-M2) between the number average molecular weight (M1) of the first block copolymer and the number average molecular weight (M2) of the second block copolymer in the polymer composition may be within 100 kg/mol. In another example, the difference (M1-M2) may be about 95 Kg/mol or less, 90 Kg/mol or less, 85 Kg/mol or less, 80 Kg/mol or less, 75 Kg/Kg/mol or less, 70 Kg/mol or less, 65 Kg/mol or less, 60 Kg/mol or less, or 55 Kg/mol or less. In another example, the difference (M1−M2) may be about 5 Kg/mol or more, 10 Kg/mol or more, 15 Kg/mol or more, 20 Kg/mol or more, 25 Kg/mol or more, 30 Kg/mol or more, 35 Kg/mol or more, or 40 Kg/mol or more.

The polymer composition may further comprise other block copolymers in addition to the first and second block copolymers. In this case, the second block copolymer may have the lowest molecular weight among the block copolymers contained in the polymer composition. Also, when the total weight of all the block copolymers contained in the polymer composition is 100 weight %, the weight ratio of the second block copolymer may be in a range of about 25 weight % to 90 weight %. In another example, the weight ratio of the second block copolymer may be about 85 weight % or less, 80 weight % or less, 75 weight % or less, 70 weight % or less, 65 weight % or less, or 60 weight % or less.

Furthermore, as described above, the polymer composition may further comprise other block copolymers in addition to the first and second block copolymers. In this case, the second block copolymer may have the lowest molecular weight among the block copolymers contained in the polymer composition. In this case, when the total mole number of all the block copolymers contained in the polymer composition is 100 mol %, the molar ratio of the second block copolymer may be in a range of about 40 mol % to 90 mol %. In another example, the molar ratio of the second block copolymer may be about 45 mol % or more, or 50 mol % or more, or maybe about 85 mol % or less, 80 mol % or less, 75 mol % or less, 70 mol % or less, 65 mol % or less, or 60 mol % or less.

Under the above range, the self-assembly property and the vertical orientation property of the polymer composition can be improved.

The polymer composition may comprise the first and second block copolymers as a main component. That is, the total weight of the first and second block copolymers may be 55 weight % or more, 60 weight % or more, 65 weight % or more, 70 weight % or more, 75 weight % or more, 80 weight % or more, 85 weight % or more, 90 weight % or more, or 95 weight % or more, based on the solid content of the polymer composition. In one example, the total weight may be 100 weight % or less.

The polymer composition may comprise the first and second block copolymers as a main component, and if necessary, may further comprise other kinds of components.

Any one segment included in the first and/or second block copolymer, for example, the polymer segment A and/or C may contain a side chain as described below.

Since the block copolymer comprises two or more polymer segments connected by a covalent bond, the phase separation occurs. In the present application, at least one of the two kinds of block copolymers included in the polymer composition or both of the two copolymers satisfies the following parameters, and thus the phase separation occurs very effectively, whereby the nanoscale structure by the microphase separation can be formed. In the present application, the shape and size of the nanostructure formed by the phase separation can be freely controlled through controlling the size of the block copolymer such as the molecular weight or the relative ratio between the polymer segments. Accordingly, the block copolymer of the present application can form freely phase separation structures such as spheres, cylinders, gyroids, lamellas, and inverted structures in various sizes. The inventors of the present invention have confirmed that as the block copolymer satisfies the following parameters, the self-assembly property or the phase separation property as above is greatly improved. It has been found that the block copolymer can exhibit vertical orientation through the satisfaction of appropriate parameters. In the present application, the term vertical orientation indicates the orientation of the block copolymer, where the orientation of the nanostructures formed by the block copolymer may mean an orientation perpendicular to the substrate direction. The technique of horizontally or vertically adjusting the self-assembled structure of the block copolymer on various substrates occupies a very large proportion in the practical application of the block copolymer. Typically, the orientation of the nanostructures in the film of the block copolymer is determined by which polymer segment of the polymer segments forming the block copolymer is exposed to the surface or air. Generally, since a number of substrates are polar and air is non-polar, the polymer segment having a larger polarity among the polymer segments of the block copolymer is wetted to the substrate, and the polymer segment having smaller polarity is wetted at the interface with air. Therefore, various techniques have been proposed to allow the polymer segments having different characteristics of the block copolymer to be wetted simultaneously on the substrate side, where the most representative technique is the orientation adjustment applied by neutral surface preparation. However, in one aspect of the present application, by properly adjusting the following parameters, the block copolymer can also be vertically oriented with respect to the substrate without being subjected to the known processing, noted for achieving vertical orientation, including the neutral surface treatment or the like. For example, the block copolymer according to one aspect of the present application may also exhibit vertical orientation both on a hydrophilic surface or a hydrophobic surface, on which no particular pretreatment has been performed. Furthermore, in a further aspect of the present application, the vertical orientation as above may also be induced in a large area in a short time by thermal annealing.

Among parameters which are mentioned herein and described below, when the value of the parameter varies according to the measured temperature, the parameter is a value measured at room temperature, unless otherwise specified. The term room temperature is a natural temperature without warming or cooling, which may mean a temperature of about 10° C. to 30° C., about 25° C. or about 23° C.

The polymer segments of the first and/or second block copolymers of the present application, for example, the polymer segments A and/or C, may exhibit a specific tendency by XRD analysis (X-ray diffraction analysis).

That is, as mentioned above, when at least one segment of the block copolymer contains a side chain, the number (n) of chain-forming atoms of the side chain can satisfy Equation 1 below with the scattering vector (q).

$$3 \text{ nm}^{-1} \text{ to } 5 \text{ nm}^{-1} = nq/(2\times\pi)$$ [Equation 1]

In Equation 1, n is a number of the chain-forming atoms, and q is the smallest scattering vector (q) in which the peak is observed in the X-ray diffraction analysis for the segment of the block copolymer, for example, the segment A and/or C, or the scattering vector (q) in which the peak of the largest peak area is observed. Also, in Equation 1, $\pi$ means the circular constant.

In the present application, the term chain-forming atom is an atom forming the side chain connected to the segment A and/or C, which means an atom forming the straight chain structure of the chain. The side chain may be linear or branched, but the number of chain-forming atoms is calculated by only the number of atoms forming the longest straight chain, where other atoms bonded to the chain-forming atoms (for example, when the chain-forming atom is a carbon atom, hydrogen atoms bonding to the carbon atom, etc.) are not calculated. For example, in the case of a side chain, the number of chain-forming atoms can be calculated as the number of chain-forming atoms forming the longest chain moiety. For example, when the side chain is an n-pentyl group, all of the chain-forming atoms are carbon atoms and the number thereof is 5, and even when the side chain is a 2-methylpentyl group, all of the chain-forming atoms are carbon atoms and the number thereof is 5. The chain-forming atom may be exemplified by carbon, oxygen, sulfur or nitrogen, and the like, and the appropriate chain-forming atom may be carbon, oxygen or nitrogen, or may be carbon or oxygen. The number of chain-forming atoms may be 8 or more, 9 or more, 10 or more, 11 or more, or 12 or more. The number of the chain-forming atoms may be 30 or less, 25 or less, 20 or less, or 16 or less.

The XRD analysis for confirmation of Equation 1 can be performed by measuring a scattering intensity according to the scattering vector after transmitting X-rays to a sample to be measured, for example, a sample formed with the polymer segment A and/or C segment. The XRD analysis can be performed on the polymer segment without any special pretreatment, and for example, can be performed by drying the segment under appropriate conditions and then passing it through X-rays. As the X-ray, an X-ray having a vertical size of 0.023 mm and a horizontal size of 0.3 mm can be applied. The scattering vector and half-height width, and the like can be obtained by obtaining a 2D diffraction pattern, which is scattered and emitted from the sample, as an image using a measuring instrument (for example, 2D marCCD), and fitting the obtained diffraction pattern.

The fitting of the diffraction pattern can be performed by a numerical analytical method in which the results obtained by the XRD analysis to be described below are applied by a least-square method. In the method, the profile of the XRD patterns is subjected to Gaussian fitting in a state where a portion showing the smallest intensity in the XRD diffraction patterns is taken as a baseline and the intensity in the above is set to zero, and then the scattering vector and the half-height width can be obtained from the fitted results. The R square at the time of Gaussian fitting is at least 0.9 or more, 0.92 or more, 0.94 or more, or 0.96 or more. A method capable of obtaining the information as above from the XRD analysis is known, and for example, a numerical analysis program such as origin can be applied.

The scattering vector (q) introduced in Equation 1 may be, for example, a scattering vector (q) in a range of 0.5 nm$^{-1}$ to 10 nm$^{-1}$. In another example, the scattering vector (q) introduced in Equation 1 may be, for example, a scattering vector (q) in a range of 0.5 nm$^{-1}$ to 10 nm$^{-1}$. In another example, the scattering vector (q) introduced into Equation 1 may be 0.7 nm$^{-1}$ or more, 0.9 nm$^{-1}$ or more, 1.1 nm$^{-1}$ or more, 1.3 nm$^{-1}$ or more, or 1.5 nm$^{-1}$ or more. In another example, the scattering vector (q) introduced into Equation 1 above may be 9 nm$^{-1}$ or less, 8 nm$^{-1}$ or less, 7 nm$^{-1}$ or less, 6 nm$^{-1}$ or less, 5 nm$^{-1}$ or less, 4 nm$^{-1}$ or less, 3.5 nm$^{-1}$ or less, or 3 nm$^{-1}$ or less.

When the block copolymer has been self-assembled to form a phase separation structure, Equation 1 shows a relationship of the distance (D) between the polymer segments containing the side chains and the number of chain-forming atoms in the side chain, and when the number of chain-forming atoms of the side chain in the block copolymer having the side chain satisfies Equation 1 above, the crystallinity represented by the side chain is increased, whereby the phase separation property or the vertical orientation can be significantly improved. In another example, the $nq/(2\times\pi)$ according to Equation 1 above may also be 4.5 nm$^{-1}$ or less. Here, the distance (D, unit: nm) between the polymer segments in which the side chains are contained can be calculated by the equation $D = 2\times\pi/q$, where D is the distance (D, unit: nm) between the polymer segments, and p and q are as defined in Equation 1.

Any one segment of the polymer segments included in the first and/or second block copolymers of the present invention, for example, the polymer segment A and/or C can exhibit at least peak in a predetermined range of the scattering vector (q) upon the XRD analysis (X-ray diffraction analysis).

For example, the segment of the block copolymer, for example, the segment A and/or C, may exhibit at least one peak in the scattering vector (q) range of 0.5 $nm^{-1}$ to 10 $nm^{-1}$ in the X-ray diffraction analysis. In another example, the scattering vector (q) at which the peak appears may be 0.7 $nm^{-1}$ or more, 0.9 $nm^{-1}$ or more, 1.1 $nm^{-1}$ or more, 1.3 $nm^{-1}$ or more, or 1.5 $nm^{-1}$ or more. In another example, the scattering vector (q) at which the peak appears is 9 $nm^{-1}$ or less, 8 $nm^{-1}$ or less, 7 $nm^{-1}$ or less, 6 $nm^{-1}$ or less, 5 $nm^{-1}$ or less, 4 $nm^{-1}$ or less, 3.5 $nm^{-1}$ or less or 3 $nm^{-1}$ or less.

A half-height width (full width at half maximum, FWHM) of the peak identified in the range of the scattering vector (q) may be in a range of 0.2 to 0.9 $nm^{-1}$. In another example, the half-height width may be 0.25 $nm^{-1}$ or more, 0.3 $nm^{-1}$ or more, or 0.4 $nm^{-1}$ or more. In another example, the half-height width may be 0.85 $nm^{-1}$ or less, 0.8 $nm^{-1}$ or less, or 0.75 $nm^{-1}$ or less.

In the present application, the term half-height width may mean a width of a peak (difference of the scattering vector (q)) at a position showing the intensity of ½ of the intensity of the maximum peak. The method of obtaining the half-height width and the like is the same as described above.

The segment of the block copolymer exhibiting the peak of the half-height width in the range of the scattering vector (q) may comprise a crystalline site suitable for self-assembly. Accordingly, the block copolymer identified within the range of the above-described scattering vector (q) can exhibit excellent self-assembly properties.

The method of performing the XRD analysis for confirming the parameters is as described above.

In one aspect of the present application, the absolute value of the difference between the surface energy of any one segment (for example, polymer segment A and/or C) and the surface energy of the other polymer segment (for example, polymer segment B and/or D) in the first and/or second block copolymers contained in the polymer composition may be 10 mN/m or less, 9 mN/m or less, 8 mN/m or less, 7.5 mN/m or less, or 7 mN/m or less. The absolute value of the difference in surface energy may be 1.5 mN/m, 2 mN/m or 2.5 mN/m or more. The structure in which the two polymer segments having the absolute value of the difference in surface energy in this range are connected by covalent bonds can induce effective microphase separation by phase separation due to non-compatibility.

The surface energy can be measured using a drop shape analyzer (DSA100 product from KRUSS). Specifically, the surface energy can be measured for a film in which a coating liquid obtained by diluting a target sample (block copolymer or homopolymer), which is measured, in fluorobenzene to a solid concentration of about 2 weight %, is coated on a substrate to a thickness of about 50 nm and a coating area of 4 $cm^2$ (width: 2 cm, height: 2 cm), and dried at room temperature for about 1 hour, and then subjected to thermal annealing at 160° C. for about 1 hour. The process of dropping the deionized water whose surface tension is known on the film subjected to the thermal annealing and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane. The numerical value of the surface energy for each polymer segment of the block copolymer can be obtained for a homopolymer made of only the monomer forming the polymer segment by the above-described method.

When the block copolymer comprises the above-described side chain, the polymer segment comprising the side chain may have a higher surface energy than the other polymer segment. For example, if the polymer segment A and/or C of the block copolymer comprises the side chain, the polymer segment A and/or C may have a higher surface energy than the polymer segment B and/or D. In this case, the surface energy of the polymer segment A and/or C may be in a range of about 20 mN/m to 40 mN/m. The surface energy of the polymer segment A and/or C may be 22 mN/m or more, 24 mN/m or more, 26 mN/m or more, or 28 mN/m or more. The surface energy of the polymer segment A and/or C may be 38 mN/m or less, 36 mN/m or less, 34 mN/m or less, or 32 mN/m or less. The polymer composition comprising the block copolymer containing such a polymer segment A and/or C and exhibiting a difference in surface energy from the polymer segment B and/or D as above can exhibit excellent self-assembly properties.

The absolute value of the difference in density between two polymer segments, for example, the polymer segment A and/or C and the polymer segment B and/D, in the block copolymer may be 0.25 $g/cm^3$ or more, 0.3 $g/cm^3$ or more, 0.35 $g/cm^3$ or more, 0.4 $g/cm^3$ or more, or 0.45 $g/cm^3$ or more. The absolute value of the difference in density may be 0.9 $g/cm^3$ or more, 0.8 $g/cm^3$ or less, 0.7 $g/cm^3$ or less, 0.65 $g/cm^3$ or less, or 0.6 $g/cm^3$ or less. The structure in which two kinds of polymer segments having the absolute value of the density difference in this range are linked by covalent bonds can induce effective microphase separation by phase separation due to proper non-compatibility.

The density of each polymer segment can be measured using a known buoyancy method, and for example, the density can be measured by analyzing the mass of a sample in a solvent, such as ethanol, which is known in mass and density in air.

When the block copolymer comprises the above-described side chain, the polymer segment comprising the side chain may have a lower density than the other polymer segment. For example, if the polymer segment A and/or C of the block copolymer comprises the side chain, the polymer segment A and/or C may have a lower density than the polymer segment B and/or D. In this case, the density of the polymer segment A and/or C may be in a range of about 0.9 $g/cm^3$ to 1.5 $g/cm^3$ or so. The density of the polymer segment A and/or C may be 0.95 $g/cm^3$ or more. The density of the polymer segment A and/or C may be 1.4 $g/cm^3$ or less, 1.3 $g/cm^3$ or less, 1.2 $g/cm^3$ or less, 1.1 $g/cm^3$ or less, or 1.05 $g/cm^3$ or less. The polymer composition comprising the block copolymer comprising such a polymer segment A and/or C and exhibiting a density difference with the polymer segment B and/or D as above can exhibit excellent self-assembly properties.

The parameter can be achieved, for example, through control of the structure.

For example, the polymer segment satisfying the above parameters may comprise a side chain having the chain-forming atoms.

For example, the segment A and/or C satisfying the above-mentioned parameters may comprise at least an aromatic structure. The two kinds of segments included in one block copolymer, for example, the segments A and B or the segments C and D may all contain an aromatic structure, and in this case, the aromatic structures contained in each segment may be the same or different. In addition, at least one of the two segments of the block copolymer satisfying one or more of the parameters mentioned herein may comprise the side chain, or may comprise one or more halogen atoms to be described below, where such a side chain or halogen atom may be substituted on the aromatic structure.

The two segments included in one block copolymer, for example, the segments A and B or the segments C and D may contain an aromatic structure. Such an aromatic structure may be included in only any one of the segments A and B or the segments C and D, or may be included in both. When both contain the aromatic structures, the aromatic structures included in each segment may be the same or different from each other.

The term aromatic structure, aryl group or arylene group herein may mean, unless otherwise specified, a structure, a monovalent residue or a divalent residue, derived from a compound having a benzene ring or comprising a structure in which two or more benzene rings are linked while sharing one or two carbon atoms, or linked by any linker, or a derivative thereof. The aryl group or arylene group may be, for example, an aryl group having 6 to 30 carbon atoms, 6 to 25 carbon atoms, 6 to 21 carbon atoms, 6 to 18 carbon atoms, or 6 to 13 carbon atoms. The aryl group or arylene group may also be exemplified by a monovalent or divalent residue, and the like, derived from benzene and the like, or naphthalene, azobenzene, anthracene, phenanthrene, tetracene, pyrene or benzopyrene and the like.

The aromatic structure may be a structure contained in the main chain of the polymer segment, or may be a structure which is linked to the main chain in the form of a side chain. The parameters mentioned herein may be controlled through appropriate control of the aromatic structure that each segment may contain.

For example, for the control of the parameters, any one segment of the block copolymer, for example, the segment A and/or C may have a chain with 8 or more chain-forming atoms connected to the side chain. In this specification, the term chain and side chain may refer to the object identical to each other. When the segment A and/or C comprises an aromatic structure, the chain may be connected to the aromatic structure.

The side chain may be a chain comprising 8 or more, 9 or more, 10 or more, 11 or more, or 12 or more chain-forming atoms, as mentioned above. Also, the number of the chain-forming atoms may be 30 or less, 25 or less, 20 or less, or 16 or less. The chain-forming atom may be a carbon, oxygen, nitrogen or sulfur atom and may suitably be carbon or oxygen.

As the side chain, a hydrocarbon chain such as an alkyl group, an alkenyl group or an alkynyl group can be exemplified. At least one of the carbon atoms of the hydrocarbon chain may be replaced by a sulfur atom, an oxygen atom or a nitrogen atom.

When the side chain is connected to the aromatic structure, the chain may be directly connected to the aromatic structure or may be connected via a linker. The linker may be exemplified by an oxygen atom, a sulfur atom, $-NR_1-$, $-S(=O)_2-$, a carbonyl group, an alkylene group, an alkenylene group, an alkynylene group, $-C(=O)-X_1-$ or $-X_1-C(=O)-$, where $R_1$ may be hydrogen, an alkyl group, an alkenyl group, an alkynyl group, an alkoxy group or an aryl group, and $X_1$ may be a single bond, an oxygen atom, a sulfur atom, $-NR_2-$, $-S(=O)_2-$, an alkylene group, an alkenylene group or an alkynylene group, where $R_2$ may be hydrogen, an alkyl group, an alkenyl group, an alkynyl group, an alkoxy group or an aryl group. The suitable linker may be exemplified by an oxygen atom. The side chain may be connected to a ring structure such as an aromatic structure, for example, via an oxygen atom or a nitrogen atom.

When the aromatic structure is connected to the main chain of the polymer segment in a side chain form, the aromatic structure may also be directly connected to the main chain or may be connected via a linker. In this case, the linker can be exemplified by an oxygen atom, a sulfur atom, $-S(=O)_2-$, a carbonyl group, an alkylene group, an alkenylene group, an alkynylene group, $-C(=O)-X_1-$ or $-X_1-C(=O)-$, where $X_1$ may be a single bond, an oxygen atom, a sulfur atom, $-S(=O)_2-$, an alkylene group, an alkenylene group or an alkynylene group. The suitable linker connecting the aromatic structure to the main chain can be exemplified by $-C(=O)-O-$ or $-O-C(=O)-$, but is not limited thereto.

In another example, the aromatic structure contained in the polymer segment of the block copolymer, for example, the segment B and/or D may comprise 1 or more, 2 or more, 3 or more, 4 or more, or 5 or more halogen atoms. The number of halogen atoms may be, for example, 30 or less, 25 or less, 20 or less, 15 or less, or 10 or less. The halogen atom may be exemplified by fluorine or chlorine, and the like, and the use of a fluorine atom may be advantageous. As described above, the polymer segment having an aromatic structure containing a halogen atom can efficiently realize a phase separation structure through proper interaction with other polymer segments.

The aromatic structure containing a halogen atom can be exemplified by an aromatic structure having 6 to 30 carbon atoms, 6 to 25 carbon atoms, 6 to 21 carbon atoms, 6 to 18 carbon atoms, or 6 to 13 carbon atoms, but is not limited thereto.

In the case where two polymer segments of each block copolymer, for example, polymer segments A and B and/or polymer segments C and D all contain an aromatic structure, the polymer segment A and/or C may comprise an aromatic structure without any halogen atom, and the polymer segment B and/or D may comprise an aromatic structure comprising a halogen atom. In addition, the above-mentioned side chains may be connected to the aromatic structure of the polymer segment A and/or C directly or via a linker including oxygen or nitrogen.

In the case where the block copolymer comprises a polymer segment having a side chain, this polymer segment, that is, the polymer segment A and/or C may be, for example, a polymer segment represented by Formula 1 below.

[Formula 1]

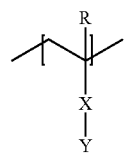

In Formula 1, R is hydrogen or an alkyl group having 1 to 4 carbon atoms, X is a single bond, an oxygen atom, a sulfur atom, $-S(=O)_2-$, a carbonyl group, an alkylene group, an alkenylene group, an alkynylene group, —C(=O)—X$_1$— or —X$_1$—C(=O)—, where X$_1$ is an oxygen atom, a sulfur atom, —S(=O)$_2$—, an alkylene group, an alkenylene group or an alkynylene group, and Y is a monovalent substituent comprising a ring structure to which a chain having 8 or more chain-forming atoms is linked.

In the present application, the term single bond means that no separate atom is present at that site. For example, when X in Formula 1 is a single bond, a structure in which Y is directly connected to a polymer chain can be realized.

The term alkyl group herein may be, unless otherwise specified, a linear, branched or cyclic alkyl group having 1 to 20 carbon atoms, 1 to 16 carbon atoms, 1 to 12 carbon atoms, 1 to 8 carbon atoms, or 1 to 4 carbon atoms, which may be optionally substituted by one or more substituents (provided that when the aforementioned side chain is an alkyl group, the alkyl group may comprise 8 or more, 9 or more, 10 or more, 11 or more, or 12 or more carbon atoms, and the number of carbon atoms of this alkyl group may be 30 or less, 25 or less, 20 or less, or 16 or less).

The term alkenyl or alkynyl group herein may be, unless otherwise specified, a linear, branched, or cyclic alkenyl group or alkynyl group having 2 to 20 carbon atoms, 2 to 16 carbon atoms, 2 to 12 carbon atoms, 2 to 8 carbon atoms, or 2 to 4 carbon atoms, which may be optionally substituted by one or more substituents (provided that the aforementioned alkenyl group or alkynyl group as the side chain may comprise 8 or more, 9 or more, 10 or more, 11 or more, or 12 or more carbon atoms, and the number of carbon atoms of this alkenyl group or alkynyl group may be 30 or less, 25 or less, 20 or less, or 16 or less).

The term alkylene group herein may be, unless otherwise specified, a linear, branched or cyclic alkylene group having 1 to 20 carbon atoms, 1 to 16 carbon atoms, 1 to 12 carbon atoms, 1 to 8 carbon atoms, or 1 to 4 carbon atoms, which may be optionally substituted by one or more substituents.

The term alkenylene group or alkynylene group herein may be, unless otherwise specified, a linear, branched or cyclic alkylene group having 1 to 20 carbon atoms, 1 to 16 carbon atoms, 1 to 12 carbon atoms, 1 to 8 carbon atoms or 1 to 4 carbon atoms, which may be optionally substituted by one or more substituents.

Also, in another example, X in Formula 1 may be —C(=O)O— or —OC(=O)—.

In Formula 1, Y is a substituent comprising the above-described chain, which may be, for example, a substituent containing an aromatic structure having 6 to 18 carbon atoms or 6 to 12 carbon atoms. Here, the chain may be, for example, a linear alkyl group containing 8 or more, 9 or more, 10 or more, 11 or more, or 12 or more carbon atoms. This alkyl group may contain 30 or less, 25 or less, 20 or less, or 16 or less carbon atoms. Such a chain may be linked to the aromatic structure directly or via the above-mentioned linker.

In another example, the polymer segment, that is, the polymer segment A and/or C may be represented by Formula 2 below. [75]

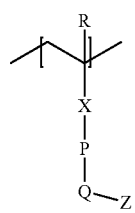

[Formula 2]

In Formula 2, R is hydrogen or an alkyl group having 1 to 4 carbon atoms, X is —C(=O)—O—, P is an arylene group having 6 to 12 carbon atoms, Q is an oxygen atom, and Z is the chain having 8 or more chain-forming atoms.

In another example, P in Formula 3 may be phenylene, and in another example, Z may be a linear alkyl group having 9 to 20 carbon atoms, 9 to 18 carbon atoms, or 9 to 16 carbon atoms. Here, when P is phenylene, Q may be connected to the para position of the phenylene. Here, the alkyl group, arylene group, phenylene group and chain may be optionally substituted with one or more substituents.

When the block copolymer comprises a polymer segment having an aromatic structure containing a halogen atom, the polymer segment may be, for example, a polymer segment represented by Formula 3 below. The segment may be, for example, the polymer segment B and/or D.

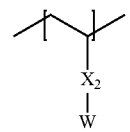

[Formula 3]

In Formula 3, X$_2$ is a single bond, an oxygen atom, a sulfur atom, —S(=O)$_2$—, an alkylene group, an alkenylene group, an alkynylene group, —C(=O)—X$_1$— or —X$_1$—C(=O)—, where X$_1$ is a single bond, an oxygen atom, a sulfur atom, —S(=O)$_2$—, an alkylene group, an alkenylene group or an alkynylene group, and W is an aryl group containing at least one halogen atom.

In another example, X$_2$ in Formula 3 may be a single bond or an alkylene group.

In Formula 3, the aryl group of W may be an aryl group having 6 to 12 carbon atoms or a phenyl group, and this aryl group or phenyl group may contain 1 or more, 2 or more, 3 or more, 4 or more, or 5 or more halogen atoms. Here, the number of halogen atoms may be, for example, 30 or less, 25 or less, 20 or less, 15 or less, or 10 or less. As the halogen atom, a fluorine atom may be exemplified.

In another example, the polymer segment of Formula 3 may be represented by Formula 4 below.

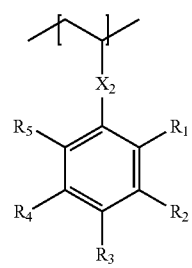

[Formula 4]

In Formula 4, X$_2$ is the same as defined in Formula 2, R$_1$ to R$_5$ are each independently hydrogen, an alkyl group, a haloalkyl group or a halogen atom, and the number of halogen atoms contained in R$_1$ to R$_5$ is 1 or more.

In Formula 4, R$_1$ to R$_5$ may be each independently a hydrogen atom, an alkyl group having 1 to 4 carbon atoms or a haloalkyl group having 1 to 4 carbon atoms or halogen, where halogen may be chlorine or fluorine.

In Formula 4, 2 or more, 3 or more, 4 or more, 5 or more, or 6 or more of R$_1$ to R$_5$ may include halogen atoms. The upper limit of the number of the halogen atom is not particularly limited and may be, for example, 12 or less, 8 or less, or 7 or less.

The block copolymer may be a block copolymer comprising any one or both of the two polymer segments as above together with other polymer segments or comprising only the two polymer segments.

The manner of producing the block copolymer is not particularly limited. The block copolymer may be polymerized by, for example, an LRP (Living Radical Polymerization) method, and the example thereof includes anionic polymerization in which the block copolymer is synthesized in the presence of an inorganic acid salt such as an alkali metal or an alkali earth metal by using an organic rare earth metal complex as a polymerization initiator or by using an organic alkali metal compound as a polymerization initiator, an anionic polymerization method in which the block copolymer is synthesized in the presence of an organic aluminum compound by using an organic alkali metal compound as a polymerization initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method (ATRP), a polymerization method by reversible addition-fragmentation chain transfer (RAFT) using an inorganic reducing agent and a reversible addition-fragmentation chain transfer agent or a method of using an organotellurium compound as an initiator, and the like, and a suitable method may be selected among these methods and applied.

For example, the block copolymer can be prepared in a manner comprising polymerizing a reactant comprising monomers capable of forming the polymer segments in the presence of a radical initiator and a living radical polymerization reagent by a living radical polymerization method. The process of producing the polymer segment copolymer may further comprise, for example, a process of precipitating the polymerization product produced through the above processes in a non-solvent.

The kind of the radical initiator is not particularly limited, which may be appropriately selected in consideration of polymerization efficiency, and for example, an azo compound such as AIBN (azobisisobutyronitrile) or 2,2'-azobis-(2,4-dimethylvaleronitrile), or peroxide series such as BPO (benzoyl peroxide) or DTBP (di-t-butyl peroxide) may be used.

The living radical polymerization process may be performed in a solvent such as, for example, methylene chloride, 1,2-dichloroethane, chlorobenzene, dichlorobenzene, benzene, toluene, acetone, chloroform, tetrahydrofuran, dioxane, monoglyme, diglyme, dimethylformamide, dimethylsulfoxide or dimethylacetamide.

As the non-solvent, an alcohol such as methanol, ethanol, normal propanol or isopropanol, a glycol such as ethylene glycol, n-hexane, cyclohexane, n-heptane or ether series such as petroleum ether can be used, without being limited thereto.

The polymer composition comprising the block copolymers as above exhibits excellent phase separation or self-assembly properties basically and has excellent vertical orientation as well.

In the case where the polymer composition comprises the first and second block copolymers, the first block copolymer of them comprises the polymer segments A and B and the second block copolymer comprises the polymer segments C and D, the total volume fraction of the polymer segments A and C may be in the range of 0.3 to 0.6 and the sum of the total volume fractions of the polymer segments A, B, C and D may be 1.

In another example, the total volume fraction of A and C may be about 0.32 or more, about 0.34 or more, about 0.36 or more, about 0.38 or more, or about 0.4 or more, or may be about 0.58 or less, 0.56 or less, 0.54 or less, 0.52, or less, or 0.5 or less, or may be less than 0.5.

The polymer composition comprising two block copolymers containing each segment at such a volume fraction can exhibit excellent self-assembly properties. The volume fraction of each polymer segment of the block copolymer can be determined based on the density and the molecular weight measured by GPC (gel permeation chromatography), of each polymer segment.

The present application also relates to a polymer film comprising the polymer composition. The polymer film may be used for various applications, and for example, may be used for various electric or electronic elements, a process of forming the pattern, a recording medium such as a magnetic storage medium and a flash memory, or a biosensor, and the like.

In one example, the first and/or second block copolymers in the polymer film may implement a periodic structure including a sphere, a cylinder, a gyroid, a lamella, or the like through self-assembly. Such a structure may be vertically oriented.

The present application also relates to a method for forming a polymer film using the block copolymer. The method may comprise forming a polymer film comprising the block copolymer in a self-assembled state on a substrate. For example, the method may comprise a process of applying the block copolymer or a coating liquid comprising the same to form a layer, and annealing it. Here, the annealing process may be a thermal annealing process, or may be a solvent annealing process.

The thermal annealing may be performed based on, for example, the phase transition temperature or the glass transition temperature of the block copolymer, and may be performed at, for example, a temperature above the glass transition temperature or the phase transition temperature. The time for which this thermal annealing is performed is not particularly limited, and the treatment can be performed within a range of, for example, about 1 minute to 72 hours, but the time can be changed as needed. In the thermal annealing process, the heat treatment temperature may be, for example, about 100° C. to 250° C., but this may be changed in consideration of the block copolymer to be used.

In addition, the solvent annealing process may also be performed in an appropriate non-polar solvent and/or polar solvent at room temperature for about 1 minute to 72 hours.

The present application also relates to a patterning method. For example, the method may comprise a process of selectively removing a first polymer segment or a second polymer segment of the block copolymer from a laminate having a substrate, and the polymer film formed on the surface of the substrate and comprising the self-assembled block copolymer. The method may be a method of forming a pattern on the substrate. For example, the method may comprise forming a polymer film comprising the block copolymer on a substrate, selectively removing one or more polymer segments of the block copolymer present in the film, and then etching the substrate. In this way, it is possible to form, for example, a nanoscale fine pattern. In addition, various types of patterns such as nano-rods or nano-holes can be formed through the above-described method depending on the shape of the block copolymer in the polymer film. If necessary, a copolymer different from the block copolymer or a homopolymer, and the like may be mixed for pattern formation. The type of the substrate to be applied to this method is not particularly limited and may be selected as needed, and for example, silicon oxide or the like may be applied.

For example, the method can form a nanoscale pattern of silicon oxide exhibiting a high aspect ratio. For example, after forming the polymer film on silicon oxide and selectively removing any one polymer segment of the block copolymer in a state where the block copolymer in the polymer film forms a predetermined structure, the silicon oxide may be etched by various ways, for example, reactive ion etching or the like to realize various shapes including patterns of nano-rods or nano-holes, and the like. In addition, a nanopattern having a large aspect ratio can be realized through such a method.

For example, the pattern can be implemented on a scale of several tens of nanometers, and such a pattern can be utilized for various applications including, for example, a next generation information electronic magnetic recording medium and the like.

The method of selectively removing any one polymer segment of the block copolymer in the above method is not particularly limited, and for example, a method of removing a relatively soft polymer segment by irradiating the polymer film with an appropriate electromagnetic wave, for example, ultraviolet or the like, can be used. In this case, the ultraviolet irradiation condition is determined according to the type of the polymer segment of the block copolymer, and the method can be performed, for example, by being irradiated with ultraviolet having a wavelength of about 254 nm for 1 minute to 60 minutes.

Following the ultraviolet irradiation, a step of treating the polymer film with an acid or the like to further remove the segment decomposed by ultraviolet may also be performed.

The step of etching the substrate using the polymer film in which the polymer segments are selectively removed as a mask is not particularly limited, which may be performed, for example, through a reactive ion etching step using $CF_4$/Ar ions or the like and following this process, a step of removing the polymer film from the substrate by an oxygen plasma treatment or the like may also be performed.

Advantageous Effects

The present application may provide a polymer composition having excellent self-assembly properties and capable of forming a vertical orientation structure even on a surface that no neutral treatment is performed, where the vertically oriented self-assembled structure can be effectively formed in a short time, and a use thereof.

BRIEF DESCRIPTION OF DRAWINGS

The FIGURE is an SEM photograph of the polymer film of Example 1.

MODE FOR INVENTION

Hereinafter, the present application will be described in detail by way of examples according to the present application and comparative examples, but the scope of the present application is not limited by the following examples.

1. NMR Measurement

NMR analyses were performed at room temperature using an NMR spectrometer including a Varian Unity Inova (500 MHz) spectrometer with a triple resonance 5 mm probe. The analytes were diluted in a solvent for NMR measurement ($CDCl_3$) to a concentration of about 10 mg/ml, and chemical shifts were expressed in ppm.

<Application Abbreviation> br=broad signal, s=singlet, d=doublet, dd=double doublet, t=triplet, dt=double triplet, q=quartet, p=quintet, m=multiplet.

2. GPC (Gel Permeation Chromatograph)

The number average molecular weight (Mn) and the molecular weight distribution were measured using GPC (gel permeation chromatography). Into a 5 mL vial, an analyte such as block copolymers of Examples or Comparative Examples or a giant initiator is put and diluted in THF (tetrahydrofuran) to be a concentration of about 1 mg/mL or so. Then, a standard sample for calibration and a sample to be analyzed were filtered through a syringe filter (pore size: 0.45 μm) and then measured. As the analytical program, ChemStation from Agilent Technologies was used, and the elution time of the sample was compared with the calibration curve to obtain the weight average molecular weight (Mw) and the number average molecular weight (Mn), respectively, and the molecular weight distribution (PDI) was calculated by the ratio (Mw/Mn) thereof. The measurement conditions of GPC are as follows.

<GPC Measurement Condition>

Instrument: 1200 series from Agilent Technologies

Column: using two PLgel mixed B from Polymer Laboratories

Solvent: THF

Column temperature: 35° C.

Sample concentration: 1 mg/mL, 200 L injection

Standard samples: polystyrene (Mp: 3900000, 723000, 316500, 52200, 31400, 7200, 3940, 485)

3. XRD Analysis Method

The XRD analysis was performed by transmitting X rays to a sample at a Pohang accelerator 4C beamline to measure the scattering intensity according to the scattering vector (q). As the sample, a block copolymer in a powder state dried by purifying a synthesized block copolymer without special pretreatment and then maintaining it in a vacuum oven for one day or so, was placed in a cell for XRD measurement and used. Upon the XRD pattern analysis, an X-ray with a vertical size of 0.023 mm and a horizontal size of 0.3 mm was used and a 2D marCCD was used as a detector. A 2D diffraction pattern scattered and exited was obtained as an image. The obtained diffraction pattern was analyzed by a numerical analytical method to which a least-square method was applied to obtain information such as a scattering vector and a half-height width. Upon the analysis, an origin program was applied, and the profile of the XRD patterns was subjected to Gaussian fitting in a state where a portion showing the smallest intensity in the XRD diffraction patterns was taken as a baseline and the intensity in the above was set to zero, and then the scattering vector and the half-height width were obtained from the fitted results. Upon Gaussian fitting, the R square was at least set to be 0.96 or more.

4. Measurement of Surface Energy

The surface energy was measured using a drop shape analyzer (DSA100 product from KRUSS). A coating liquid was prepared by diluting the substance (polymer), which is measured, in fluorobenzene to a solid concentration of about 2 weight %, and the prepared coating liquid was spin-coated on a silicon wafer to a thickness of about 50 nm and a coating area of 4 cm² (width: 2 cm, height: 2 cm). The coating layer was dried at room temperature for about 1 hour and then subjected to thermal annealing at about 160° C. for about 1 hour. The process of dropping the deionized water whose surface tension was known on the film subjected to thermal annealing and obtaining the contact angle thereof was repeated five times to obtain an average value of the obtained five contact angle values. In the same manner, the process of dropping the diiodomethane whose surface tension was known thereon and obtaining the contact angle thereof was repeated five times to obtain an average value of the obtained five contact angle values. The surface energy was obtained by substituting the value (Strom value) regarding the solvent surface tension by the Owens-Wendt-Rabel-Kaelble method using the obtained average values of the contact angles for the deionized water and diiodomethane. The numerical value of the surface energy for each polymer segment of the block copolymer was obtained for a homopolymer made of only the monomer forming the polymer segment by the above-described method.

5. Measurement of Volume Fraction

The volume fraction of each polymer segment of the block copolymer was calculated based on the density of each polymer segment at room temperature and the molecular weight measured by GPC. Here, the density was measured using a buoyancy method, and specifically, it was calculated by placing a sample to be analyzed in a solvent (ethanol) to know the mass and density in air, and measuring the mass.

Preparation Example 1. Synthesis of Monomer (A)

A compound (DPM-C12) of Formula A below was synthesized in the following manner. Hydroquinone (10.0 g, 94.2 mmol) and 1-bromododecane (23.5 g, 94.2 mmol) were placed in a 250 mL flask, dissolved in 100 mL of acetonitrile, and then an excess amount of potassium carbonate was added thereto and reacted at 75° C. for about 48 hours under a nitrogen condition. After the reaction, the remaining potassium carbonate was filtered off and the acetonitrile used in the reaction was also removed. A mixed solvent of DCM (dichloromethane) and water was added thereto to work up the mixture, and the separated organic layers were collected and passed through MgSO₄ to be dehydrated. Subsequently, the target product (4-dodecyloxyphenol) (9.8 g, 35.2 mmol) in a white solid phase was obtained in a yield of about 37% using DCM (dichloromethane) in column chromatography.

<NMR Analysis Result>

¹H-NMR (CDCl₃): d6.77 (dd, 4H); δd4.45 (s, 1H); d3.89 (t, 2H); d1.75 (p, 2H); d1.43 (p, 2H); d1.33-1.26 (m, 16H); d0.88 (t, 3H).

The synthesized 4-docecyloxyphenol (9.8 g, 35.2 mmol), methacrylic acid (6.0 g, 69.7 mmol), DCC (dicyclohexylcarbodiimide) (10.8 g, 52.3 mmol) and DMAP (p-dimethylaminopyridine) (1.7 g, 13.9 mmol) were placed in the flask and 120 mL of methylene chloride was added thereto, and then reacted at room temperature for 24 hours under nitrogen. After completion of the reaction, the salt (urea salt) generated during the reaction was filtered off and the remaining methylene chloride was also removed. Impurities were removed using hexane and DCM (dichloromethane) as the mobile phase in column chromatography and the product obtained again was recrystallized in a mixed solvent of methanol and water (1:1 mix) to obtain the target product (7.7 g, 22.2 mmol) in a white solid phase in a yield of 63%.

<NMR Analysis Result>

¹H-NMR (CDCl₃): d7.02 (dd, 2H); δd6.89 (dd, 2H); d6.32 (dt, 1H); d5.73 (dt, 1H); d3.94 (t, 2H); δd 2.05 (dd, 3H); d1.76 (p, 2H); δd1.43 (p, 2H); 1.34-1.27 (m, 16H); d0.88 (t, 3H).

[Formula A]

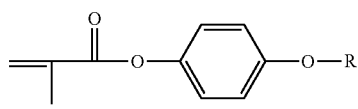

In Formula A, R is a linear alkyl group having 12 carbon atoms.

Preparation Example 2. Synthesis of Block Copolymer (A)

6.0 g of the monomer (A) of Preparation Example 1, 64 mg of cyanoisoproyl dithiobenzoate as an RAFT (reversible addition-fragmentation chain transfer) reagent, 23 mg of AIBN (azobisisobutyronitrile) as a radical initiator and 5.34 mL of benzene were placed in a 10 mL Schlenk flask and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The yield of the macro initiator was about 82.6 weight %, and the number average molecular weight (Mn) and the molecular weight distribution (Mw/Mn) were 29 Kg/mol and 1.16, respectively. 0.3 g of the macro initiator, 10 g of a pentafluorostyrene monomer and 5 mL of benzene were placed in a 50 mL Schlenk flask and stirred at room temperature for 30 minutes under a nitrogen atmosphere, and then an RAFT (reversible addition-fragmentation chain transfer) polymerization reaction was performed at 115° C. for 4 hours. After the polymerization, the reaction solution was precipitated in 250 mL of methanol as an extraction solvent, and then filtered under reduced pressure and dried to prepare a pale pink polymer segment copolymer. The yield of the block copolymer was about 18 weight %, and the number average molecular weight (Mn) and the molecular weight distribution (Mw/Mn) were 73 Kg/mol and 1.13, respectively. The block copolymer comprises a polymer segment A derived from the monomer (A) of Preparation Example 1 and a polymer segment B derived from the pentafluorostyrene monomer.

Preparation Examples 3 to 5

Three kinds of block copolymers having different molecular weights were further prepared in the same manner as in Preparation Example 1 except for controlling the molar ratios of the monomer and the macro initiator, and the like. The characteristics of the macro initiator and the block copolymer used in each preparing process were summarized and described in Table 1 below.

TABLE 1

| | | Preparation Example | | | |
|---|---|---|---|---|---|
| | | 2 | 3 | 4 | 5 |
| Block copolymer | | A | B | C | D |
| Macro initiator | Molecular weight (Mn) | 29 | 21 | 8 | 6 |
| | Molecular weight distribution | 1.16 | 1.2 | 1.11 | 1.19 |
| Block copolymer | Molecular weight (Mn) | 73 | 68 | 23 | 21 |
| | Molecular weight distribution | 1.13 | 1.1 | 1.15 | 1.21 |
| | Volume fraction | 0.49 | 0.58 | 0.56 | 0.64 |

Molecular weight (Mn): number average molecular weight (unit: Kg/mol)
Molecular weight distribution (Mw/Mn): ratio (Mw/Mn) of weight average molecular weight (Mw) to number average molecular weight (Mn)
Volume fraction: volume fraction of polymer segment B (the total volume fraction of segments A and B is 1)

The block copolymers (A) to (D) prepared above all contain a side chain having 12 chain-forming atoms in the segment A (the R moiety of Formula A above). Furthermore, for each block copolymer, the value of n/D, that is, the numerical value calculated by $nq/(2\times\pi)$ in Equation 1 above (in Equation 1 above, n is the number of chain-forming atoms (12), q is the scattering vector value at which the peak with the largest peak area is identified in the scattering vector range of 0.5 $nm^{-1}$ to 10 $nm^{-1}$) was about 3.75 for all, the surface energy of the polymer segment A was about 30.83 mN/m in all the four block copolymers, and the surface energy of the polymer segment B was also about 24.4 mN/m in all the four block copolymers. In addition, the density of the polymer segment A was about 1 $g/cm^3$ in all the four block copolymers, and the density of the polymer segment B was about 1.57 $g/cm^3$.

Example 1

The block copolymer (A) of Preparation Example 2 and the block copolymer (C) of Preparation Example 4 were mixed to prepare a polymer composition. The ratio of the block copolymer (A) in the polymer composition was 75 weight %, and the ratio of the block copolymer (C) was 25 weight %. Subsequently, a coating liquid prepared by diluting the polymer composition in toluene to a solid concentration of about 1.5 weight % was spin-coated on a substrate, dried at room temperature for about 1 hour, and then thermally annealed at a temperature of about 200° C. for about 10 minutes to form a self-assembled film. Here, as the substrate, a known silicon wafer without any neutral treatment on its surface was applied. An SEM (scanning electron microscope) image of the formed film was photographed. The FIGURE is an SEM image photographed in Example 1, and as confirmed from the drawing, it was confirmed that in the case of the polymer composition of Example 1, the vertically oriented self-assembled lamellar structure was effectively formed.

Example 2

A polymer film was formed in the same manner as in Example 1 except that the ratio of the block copolymer (A) in the polymer composition was 60 weight % and the ratio of the block copolymer (C) was 40 weight %, and the evaluation results thereof were summarized and described in Table 2 below.

Example 3

A polymer film was formed in the same manner as in Example 1 except that the ratio of the block copolymer (A) in the polymer composition was 40 weight % and the ratio of the block copolymer (C) was 60 weight %, and the evaluation results thereof were summarized and described in Table 2 below.

Example 4

A polymer film was formed in the same manner as in Example 2 except that the block copolymer (D) was applied instead of the block copolymer (C), and the evaluation results thereof were summarized and described in Table 2 below.

Example 5

A polymer film was formed in the same manner as in Example 2 except that the block copolymer (B) was applied instead of the block copolymer (A), and the evaluation results thereof were summarized and described in Table 2 below.

Example 6

A polymer film was formed in the same manner as in Example 5 except that the block copolymer (D) was applied instead of the block copolymer (C), and the evaluation results thereof were summarized and described in Table 2 below.

Comparative Example 1

A polymer film were formed in the same manner as in Example 1 by applying only the block copolymer (A), and the evaluation results thereof were summarized and described in Table 2 below.

TABLE 2

| | | Example | | | | | | Comparative Example |
|---|---|---|---|---|---|---|---|---|
| | | 1 | 2 | 3 | 4 | 5 | 6 | 1 |
| Polymer composition | First BCP | A | A | A | A | B | B | A |
| | Second BCP | C | C | C | D | C | D | — |
| Wt % | | 25 | 40 | 60 | 40 | 40 | 40 | — |
| Mol % | | 52 | 68 | 83 | 70 | 67 | 69 | — |
| VF | | 0.51 | 0.51 | 0.53 | 0.55 | 0.57 | 0.60 | 0.49 |

TABLE 2-continued

|  | Example | | | | | | Comparative Example |
|---|---|---|---|---|---|---|---|
|  | 1 | 2 | 3 | 4 | 5 | 6 | 1 |
| Phase separation | formed | formed | formed | formed | formed | formed | unformed |
| Pitch | 47 | 38 | 28 | 35 | 33 | 31 |  |

First BCP: type of first block copolymer
Second BCP: type of second block copolymer
Wt %: weight ratio of second block copolymer in the polymer composition (unit: weight %) (based on 100 weight % of the total weight of the first and second block copolymer)
Mol %: molar fraction of the second block copolymer in the polymer composition (unit: weight %) (based on 100 mol % of the total mole number of the first and second block copolymers)
VF: total volume fraction of polymer segments B and D in the polymer composition (based on 1 of the sum of polymer segments A, B, C and D)
Phase separation: whether or not a vertically oriented lamellar structure is formed in the same form as in the FIG of Example 1 (in the case of Comparative Example 1, a horizontal orientation phase separation structure is formed)
Pitch: distance between lamella centers in vertically oriented lamellar structure (unit: nm)

The invention claimed is:

1. A polymer composition, comprising:
a first block copolymer having a polymer segment A and a polymer segment B; and
a second block copolymer having a polymer segment C and a polymer segment D,
wherein the second block copolymer having a number average molecular weight (M2) lower than a number average molecular weight (M1) of the first block copolymer,
wherein the polymer segments A and C each comprise a side chain having 8 or more chain-forming atoms.

2. The polymer composition according to claim 1, wherein a ratio of M1 to M2 is in a range of 1.05 to 10.

3. The polymer composition according to claim 2, wherein M1 is in a range of 30 to 150 Kg/mol.

4. The polymer composition according to claim 2, wherein M2 is in a range of 10 to 80 Kg/mol.

5. The polymer composition according to claim 1, wherein a difference between M1 and M2 is less than 100 kg/mol.

6. The polymer composition according to claim 1, wherein the second block copolymer in the polymer composition has the lowest number average molecular weight and the second block copolymer has a weight ratio in a range of 25% to 90%, based on the total weight of all the block copolymers in the polymer composition.

7. The polymer composition according to claim 1, wherein the second block copolymer in the polymer composition has the lowest number average molecular weight, and the second block copolymer has a molar ratio in a range of 40% to 90%, based on the total mole number of all the block copolymers in the polymer composition.

8. The polymer composition according to claim 1, wherein the polymer segments A and C each have a side chain and exhibit an X-ray diffraction peak having a half-height width in a range of 0.2 to 1.5 $nm^{-1}$ in a scattering vector range of 0.5 to 10 $nm^{-1}$.

9. The polymer composition according to claim 1, wherein the absolute value of the difference in surface energy of the polymer segments A and B and the absolute value of the difference in surface energy of the polymer segment C and D are each in a range of 2.5 to 7 mN/m.

10. The polymer composition according to claim 1, wherein the sum of volume fractions of the polymer segments A and C is in a range of 0.3 to 0.6, and the sum of volume fractions of the polymer segments A, B, C and D is 1.

11. The polymer composition according to claim 1, wherein the polymer segments A and C each comprise a ring structure and the side chain is substituted on the ring structure.

12. The polymer composition according to claim 1, wherein the polymer segments B and D each comprise three or more halogen atoms.

13. The polymer composition according to claim 12, wherein the polymer segments B and D each comprise a ring structure and the halogen atoms are substituted on the ring structure.

14. A laminate, comprising:
a substrate; and a polymer film in contact with the substrate,
wherein the polymer film comprises the polymer composition of claim 1,
wherein the first and second block copolymers form a self-assembled structure in the polymer film, and
wherein the surface of the substrate that the polymer film contacts is not subjected to neutral treatment prior to contact with the polymer film.

15. The laminate according to claim 14, wherein the self-assembled structure is vertically oriented.

16. A method for producing a patterned substrate, comprising:
selectively removing any one polymer segment from the block copolymers forming the self-assembled structure in the polymer film of the laminate of claim 14 to expose a surface of the substrate, the exposed surface of the substrate underlying the portion of the polymer film that is removed.

17. The method for producing a patterned substrate according to claim 16, further comprising:
etching the exposed surface of the substrate using the polymer film as a mask.

18. A polymer composition, comprising:
a first block copolymer having a polymer segment A and a polymer segment B; and
a second block copolymer having a polymer segment C and a polymer segment D,
wherein the second block copolymer having a number average molecular weight (M2) lower than a number average molecular weight (M1) of the first block copolymer,
wherein the polymer segments A and C each have a side chain and exhibit an X-ray diffraction peak having a half-height width in a range of 0.2 to 1.5 $nm^{-1}$ in a scattering vector range of 0.5 to 10 $nm^{-1}$.

19. A polymer composition, comprising:
a first block copolymer having a polymer segment A and a polymer segment B; and
a second block copolymer having a polymer segment C and a polymer segment D,
wherein the second block copolymer having a number average molecular weight (M2) lower than a number average molecular weight (M1) of the first block copolymer,
wherein the absolute value of the difference in surface energy of the polymer segments A and B and the absolute value of the difference in surface energy of the polymer segment C and D are each in a range of 2.5 to 7 mN/m.

* * * * *